(12) United States Patent
Tsukagoshi et al.

(10) Patent No.: US 6,479,757 B1
(45) Date of Patent: Nov. 12, 2002

(54) METHOD OF MOUNTING A PLURALITY OF ELECTRONIC PARTS ON A CIRCUIT BOARD

(75) Inventors: Isao Tsukagoshi, Simodate (JP); Kouji Kobayashi, Nogimachi (JP); Kazuya Matsuda, Simodate (JP); Naoki Fukushima, Simodate (JP); Jyunichi Koide, Kyouwamachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/685,951

(22) Filed: Oct. 12, 2000

Related U.S. Application Data

(62) Division of application No. 08/907,017, filed on Aug. 6, 1997, now Pat. No. 6,158,115.

(30) Foreign Application Priority Data

Aug. 6, 1996 (JP) .............................. 8-206874

(51) Int. Cl.$^7$ .............................. H05K 1/02; H05K 1/03
(52) U.S. Cl. .................. 174/259; 174/256; 174/260; 361/760; 361/765; 361/783; 257/707; 257/783
(58) Field of Search .............................. 174/259, 261, 174/256, 257, 260; 361/751, 757, 765, 779, 783, 712, 790, 760; 257/737, 738, 778, 707, 783, 723, 724

(56) References Cited

U.S. PATENT DOCUMENTS

| | | | |
|---|---|---|---|
| 4,554,033 A | | 11/1985 | Dery et al. |
| 5,277,972 A | * | 1/1994 | Sakumoto et al. ..... 428/355 AK |
| 5,436,503 A | * | 7/1995 | Kunitomo et al. .......... 257/737 |
| 5,571,594 A | | 11/1996 | Minowa et al. ............ 29/740 X |
| 5,616,206 A | * | 4/1997 | Sakatsu et al. ............. 156/230 |
| 5,628,111 A | | 5/1997 | Iwasaki et al. ............ 29/740 X |
| 5,641,996 A | * | 6/1997 | Omoya et al. ............... 257/787 |
| 5,652,055 A | * | 7/1997 | King et al. .................. 428/343 |
| 5,714,252 A | | 2/1998 | Hogerton et al. ............. 29/832 |
| 5,879,761 A | | 3/1999 | Kulesza et al. ............... 29/832 |
| 6,034,331 A | * | 3/2000 | Tsukagoshi et al. ........ 174/250 |
| 6,042,894 A | * | 3/2000 | Goto et al. .................. 427/504 |
| 6,077,380 A | * | 6/2000 | Hayes et al. ................ 156/283 |

FOREIGN PATENT DOCUMENTS

| | | |
|---|---|---|
| EP | 242 626 A | 10/1987 |
| EP | 265 077 A | 4/1988 |
| EP | 285 051 A | 10/1988 |
| EP | 430 255 A | 6/1991 |
| EP | 622 839 A | 11/1994 |
| JP | 4-303582 | 10/1992 |
| JP | 7-30236 | 1/1995 |
| WO | 90/13991 A | 11/1990 |

OTHER PUBLICATIONS

Patent Abstracts of Japan, vol. 016, No. 472 (E–1272), Sep. 30, 1992 & JP 04 169080A (Shin Etsu Polymer Co. Ltd.), Jun. 17, 1992.

* cited by examiner

*Primary Examiner*—Kamand Cuneo
*Assistant Examiner*—Ishwar B. Patel
(74) *Attorney, Agent, or Firm*—Wenderoth, Lind & Ponack, L.L.P.

(57) ABSTRACT

An apparatus includes a connection sheet having a separator layer and an adhesive film layer formed on the separator layer such that said adhesive film layer can be peeled from the separator layer. The cohesive strength of the adhesive film layer decreases when the adhesive film layer is heated to a predetermined temperature. Electronic parts each have an electrode surface and at least one electrode on the electrode surface. The electrode surface of each of the electronic parts is affixed to the adhesive film layer such that the adhesive film layer coats all exposed portions of the electrode surface and coats all exposed surfaces of the at least one electrode

16 Claims, 4 Drawing Sheets

METHOD OF MOUNTING A PLURALITY OF ELECTRONIC PARTS ON A CIRCUIT BOARD

This application is a Divisional application of Ser. No. 08/907,017, filed Aug. 6, 1997 U.S. Pat. No. 6,158,115.

BACKGROUND OF THE INVENTION

1. Field of the Invention

The present invention relates to a method of mounting a plurality of electronic parts on a circuit board, and also to a method of producing adhesive-coated electronic parts suited for use in the mounting method.

2. Description of the Related Art

With a recent trend to smaller-sized, thinner electronic parts such as semiconductor chips ("electronic parts" referred to herein include resistors, capacitors, semiconductor chips, etc. mounted on circuit boards), circuits and electrodes used in such electronic parts have increased density and finer connection pitch. Since fine electrodes are difficult to connect by soldering, recently, connection methods using adhesive are widely used. The connection methods include a method in which electrically conducting particles are mixed in an adhesive, and contact bonding is performed to achieve electrical connection in the thickness direction of the adhesive (e.g., Unexamined Japanese Patent Publication (KOKAI) No. 55-104007). There is another and a method in which no conducting particles are contained in an adhesive, and contact bonding is performed to achieve electrical connection through direct contact of fine irregularities on the electrode surfaces (e.g., Unexamined Japanese Patent Publication (KOKAI) No. 60-262430).

The connection methods using adhesive permit connection at relatively low temperatures and also provide excellent reliability because the interconnecting portion has flexibility. In addition, in the case where adhesive formed into a film or tape is used, it is possible to supply the adhesive of uniform thickness in the form of a long strip, whereby the mounting line can be automated. Also, a simple step of applying heat and pressure simultaneously attains electrical connection between electrodes of the semiconductor chip and the circuit board and mechanical connection of the two through bonding. This is why the connection methods using adhesive are attracting attention.

In recent years, multi-chip modules (MCM) which employ a more elaborate form of the above methods and in which a large number of chips, are mounted at high density on circuit boards of relatively small size are drawing attention. In general, an MCM is fabricated by forming an adhesive layer on a circuit board, peeling a separator, if any, from the adhesive layer, and positioning chips such that their electrodes face corresponding electrodes on the circuit board, followed by bonding of the electrodes. Forming an adhesive layer on a chip instead presents the problem that a complicated apparatus is required because a chip having a smaller area than the circuit board needs to be applied with an adhesive layer.

Electronic parts used in MCM include a variety of chips such as semiconductor chips, active elements, passive elements, resistors and capacitors.

Thus, various types of chips having different sizes (areas, heights) are mounted on MCM. When connecting chips to a circuit board, however, a problem arises which is not associated with conventional techniques such as the method of forming an adhesive layer on a circuit board or the heat-pressure bonding method.

Specifically, in the case where the adhesive used is in the form of a film, adhesive strips (adhesive tapes) with different widths are needed depending on different chip sizes. In MCM, however, multiple chips are mounted at high density on a small-sized circuit board, and thus only a small mounting space is available, making it difficult to use a variety of tape widths. Also, use of various tape widths increases the labor involved in the management of materials. Further, since different devices for feeding, contact bonding, tape rewinding, etc. are needed for individual tape widths, the mounting apparatus is inevitably increased in overall size and is complicated, requiring a large installation space and increasing the cost.

An attempt has therefore been made to mount various sizes of chips after an adhesive layer is formed on the entire surface of a circuit board (Examined Japanese Patent Publication (KOKOKU) No. 61-27902). With this method, however, much labor is required to remove the remaining adhesive from non-connecting sections, and also the cost increases because the adhesive layer is formed uselessly on regions other than the mounting sections. Further, since the adhesive is applied to the entire surface of the circuit board, heat applied at the time of connection can adversely affect adjacent chip mounting sections. For example, the reaction of the thermosetting adhesive may progress to such an extent that the adhesive on an adjacent section where a chip is not yet mounted becomes unusable, or an adjacent chip may develop a connection defect as the adhesive softens due to the connection heat even after the chip is mounted. This is also the case with removal of a defective chip after chip mounting. Namely, it is difficult to peel off a defective chip and also to remove the adhesive because of the reaction of the thermosetting adhesive.

Also, as an attempt to form an adhesive layer with a size substantially equal to the chip size, Examined Japanese Patent Publication (KOKOKU) No. 4-30742, for example, discloses forming an adhesive layer on a wafer and then subjecting the wafer to full dicing. In this case also, various types of adhesive-coated wafers must be prepared for different types of chips, making the process control complicated in view of the shelf stability life of the adhesive.

Unexamined Japanese Patent Publications (KOKAI) No. 63-276237 and No. 2-199847, for example, disclose applying an adhesive only to the top faces of bump electrodes (also merely called bumps) on a chip, in order to reduce the connectable pitch. However, since the adhesive is applied only to the top faces of the bump electrodes, the bump electrodes are bonded to a circuit board only in areas around the bump electrodes, so that the bonding strength and the connection reliability are low. In order to also apply the adhesive to regions other than the top faces of the bump electrodes, an underfill material needs to be poured, which, however, complicates the process and increases the cost.

Further, in the case where chips with different heights are mounted or chips are mounted on both surfaces of a circuit board, heat and pressure cannot be uniformly applied by using conventional techniques generally employed, such as a press method in which a chip-carrying board is clamped by parallel mold elements or a pressure roll method using parallel rolls. Thus it is impossible to connect fine electrodes in this situation.

SUMMARY OF THE INVENTION

The present invention was created to eliminate the above-described drawbacks, and an object thereof is to provide a method of efficiently mounting electronic parts on a circuit board, groups of adhesive-coated electronic parts suited for use in the mounting method, and a method of producing adhesive-coated electronic parts.

According to a first aspect of the present invention, there is provided a method of mounting a plurality of electronic parts on a circuit board by bonding and fixing electrodes of the electronic parts to the circuit board to electrically connect the individual electronic parts to the circuit board. The method comprises: an adhesive layer formation step of forming, on an electrode surface of each of the electronic parts on which the electrodes are formed, a film-like thermosetting adhesive layer having an area substantially equal to that of the corresponding electrode surface, to obtain adhesive-coated electronic parts; a positioning step of arranging the electrodes (on which the adhesive layer is formed) so as to face corresponding electrodes of the circuit board and positioning the electrodes relative to each other; and a heat-pressure bonding step of applying heat and pressure to the electrodes of the electronic parts and the electrodes of the circuit board to fix the electrodes to each other after the electrodes are positioned.

According to the first aspect of the invention, the adhesive layer is formed beforehand on the electrode surface of each electronic part the electrode surface thus applied with the adhesive is affixed to corresponding electrodes on the circuit board, so that almost no adhesive superfluously comes out of the electrode surfaces. Accordingly, when mounting the electronic parts on the circuit board, it is unnecessary to remove superfluous adhesive, unlike the conventional process, whereby the efficiency is improved and the cost can be reduced.

The electrodes are bonded to the circuit board with heat and pressure applied thereto after the electrodes are set in position, and therefore, the electrodes can be shifted as needed and thus can be positioned with accuracy. Even in the case where electronic parts with different heights or sizes are mounted, the electrodes of the electronic parts are individually fixed with heat and pressure applied thereto, whereby the electrodes can be applied uniformly with heat and pressure and the electronic parts can be easily mounted with reliability. In particular, it is possible to connect fine electrodes.

Preferably, the area of the film-like adhesive layer falls within a range of ±30% with respect to the area of the electrode surface of the corresponding electronic part. If the area of the adhesive layer is greater than the ±30% range, too much adhesive comes out of the electrode surfaces, possibly requiring the adhesive removing step; on the other hand, if the area of the adhesive layer is smaller than the ±30% range, then there is the possibility of the electronic parts failing to be satisfactorily connected.

The electronic parts are preferably held by a heating head by means of suction, for example, so that the surfaces of the electronic parts can be heated by the heating head. The heating head serves to locate the electronic parts in predetermined position while holding the same, and then to immediately heat the electronic parts to be bonded and fixed to the circuit board. Thus the apparatus and the process can be simplified.

The heat-pressure bonding step preferably includes an inspection step of inspecting the electrical connection between the electrodes while the cohesive strength of the adhesive is increased to such an extent that the connection of the electrodes can be maintained. Namely, while the electronic parts are temporarily fixed with the cohesive force of the adhesive increased, the electrical connection is inspected. Even in the case where defective connection is discovered, repair work can be easily carried out because the electronic parts are fixed only temporarily.

According to a second aspect of the present invention, there is provided a method of mounting a plurality of electronic parts on a circuit board by bonding and fixing electrodes of the electronic parts to the circuit board to electrically connect the individual electronic parts to the circuit board. The method comprises: an adhesive layer formation step of forming, on an electrode surface of each of the electronic parts on which the electrodes are formed, a film-like thermosetting adhesive layer having an area substantially equal to that of the corresponding electrode surface, to obtain adhesive-coated electronic parts; a temporary fixing step of positioning the electrodes of the electronic parts (on which the adhesive layer is formed) so as to face corresponding electrodes of the circuit board, and increasing cohesive strength of the adhesive to such an extent that connection of the electrodes can be maintained; and a heat-pressure bonding step of applying heat and pressure to the temporarily fixed electrodes to fix the electrodes to each other, the heat-pressure bonding step including simultaneously heating a plurality of electronic parts in an autoclave with a static pressure applied thereto within the autoclave.

According to the second aspect of the invention, in the heat-pressure bonding step according to the first aspect of the invention, a plurality of electronic parts are simultaneously heated in the autoclave under the static pressure within the autoclave. Thus multiple electronic parts can be easily bonded and fixed at one time with a simple arrangement.

Also in the second aspect of the invention, the area of the film-like adhesive layer preferably falls within a range of ±30% with respect to the area of the electrode surface of the corresponding electronic part, as mentioned above.

Further, the heat-pressure bonding step preferably includes an inspection step of inspecting the electrical connection between the electrodes while the cohesive strength of the adhesive is increased to such an extent that the connection of the electrodes can be maintained. Namely, while the electronic parts are temporarily fixed with the cohesive strength of the adhesive increased, the electrical connection is inspected. Even in the case where a defective connection is discovered, repair work can be easily carried out because the electronic parts are fixed only temporarily.

According to a third aspect of the present invention, there is provided a group of adhesive-coated electronic parts each having an electrode surface coated with a film-like adhesive layer. The adhesive-coated electronic part group comprises: a connection sheet including a film-like adhesive layer and a separator from which the film-like adhesive layer can be peeled; and a plurality of electronic parts arranged on the film-like adhesive layer of the connection sheet, each of the electronic parts being affixed to the adhesive layer at an electrode surface thereof.

According to the third aspect of the invention, a plurality of electronic parts are affixed to the adhesive film. Therefore, when the electronic parts are used, they are peeled off the separator film is peeled off, so that the electrode surface of each electronic part is coated with the adhesive layer. Namely, adhesive-coated electronic parts can be readily obtained, and in the case where electronic parts are mounted on circuit boards, a connection sheet with electronic parts affixed thereon is prepared and the electronic parts are peeled off of the connection sheet, thereby obtaining adhesive-coated electronic parts ready for use. Consequently, the process control of the mounting process is facilitated, and also the adhesive-coated electronic parts have excellent shelf stability.

Preferably, the adhesive layer contains electrically conducting particles. The conducting particles serve to electrically connect electrodes facing each other with reliability and also to insulate adjacent electrodes from each other.

According to a fourth aspect of the present invention, there is provided a method of producing an adhesive-coated electronic part having an electrode surface coated with a film-like adhesive layer. The method comprising a connection sheet placement step of arranging a connection sheet including a film-like adhesive layer and a separator from which the adhesive layer can be peeled, the connection sheet having a size greater than that of an electrode surface of an electronic part on which electrodes are formed; a contacting step of bringing the electrode surface of the electronic part into contact with the adhesive layer; a heating step of heating the electrode surface to form a cohesion reduction line at which cohesive strength of the adhesive lowers, at a location between a region of the adhesive layer corresponding to the electrode surface and a region of the adhesive layer surrounding the electrode surface; and a separating step of separating the electronic part from the connection sheet such that part of the adhesive layer having a size substantially identical with that of the electrode surface is separated from the separator and adheres to the electrode surface.

According to the fourth aspect of the invention, the electrode surface of the electronic part is brought into contact with the connection sheet, and the electrodes are heated so that the cohesive strength of the adhesive around the electrodes may lower. Namely, the adhesive sets with a certain cohesive strength at normal temperature, but the cohesive strength lowers (or the adhesive softens) when the adhesive is heated up to a predetermined temperature. Accordingly, when the electronic part is separated from the connection sheet, part of the adhesive layer corresponding in size to the periphery of the electrode surface separates from the separator and adheres to the electrode surface, thus easily obtaining an adhesive-coated electronic part which is coated with an adhesive layer having a size substantially equal to that of the electrode surface.

The cohesion reduction line is formed along the periphery of the electrode surface and is the boundary between a region of the adhesive layer where the cohesive strength lowers when the electrodes are heated and a region of the adhesive layer where the cohesive strength remains almost the same. In the case of adhesive, cohesive property is different from setting or hardening property (activation). Thus the former term is applicable to both thermosetting adhesive and heat softening adhesive.

According to a fifth aspect of the invention, there is provided a method of producing an adhesive-coated electronic part having an electrode surface coated with a film-like adhesive layer. The method comprises: a connection sheet placement step of arranging a connection sheet including a film-like adhesive layer and a separator from which the adhesive layer can be peeled, the connection sheet having a size greater than that of an electronic part; a contacting step of bringing an electrode surface of the electronic part on which electrodes are formed into contact with the adhesive layer; a cutting step of pressing the electrode surface against the adhesive layer and cutting at least part of the adhesive layer along a periphery of the electronic part; and a separating step of separating the electronic part from the connection sheet such that part of the adhesive layer is separated from the separator and adheres to the electrodes.

According to the fifth aspect of the invention, the electrode surface of the electronic part is pressed against the adhesive layer of the connection sheet, and the adhesive layer is cut along the electrode surface (electronic part) to thereby separate part of the adhesive layer which is in contact with the electrode surface from the other part of the adhesive layer. Consequently, it is possible to easily obtain with reliability an adhesive layer having a size substantially identical to that of the electrode surface of the electronic part.

Preferably, the cutting step is achieved using a cutter arranged at a pressure head for pressing the electrodes of the electronic part against the connection sheet, or using a heating wire. Using the cutter arranged at the pressure head or the heating wire makes it possible to easily obtain an adhesive layer having a size substantially equal to that of the electronic part or the electrode surface.

Preferably, the connection sheet is placed on a surface plate with a cushioning member interposed therebetween. In this case, the impact at the time of application of pressure by the pressure head or at the time of cutting can be absorbed.

Further, the adhesive layer preferably contains electrically conducting particles in order to enhance the insulating property of an electrode from adjacent electrodes, as mentioned above.

DESCRIPTION OF THE PREFERRED EMBODIMENTS

The present invention will be hereinafter described with reference to the drawings illustrating embodiments thereof.

Figure 1A:
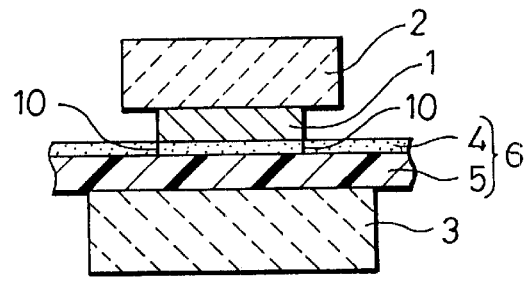
FIGS. 1A and 1B are schematic sectional views illustrating the process of a mounting method according to the present invention.

FIG. 1 schematically illustrates, in section, an embodiment of the present invention. FIG. 1A shows part of a heat-pressure bonding apparatus used in a mounting method according to the present invention. An adhesive tape 6 consisting of an adhesive layer 4 and a separator 5 is arranged between a heating head 2, which is capable of fixing a chip 1 thereon by, for example, suction, and a surface plate 3. The adhesive layer 4 is positioned so as to face an electrode surface of the chip (semiconductor chip) 1 as an electronic part. The electronic part used in this case may be an element other than the semiconductor chip, such as an active element, a passive element, a resistor or a capacitor.

The adhesive tape 6 is brought into close contact with the surface plate 3 by, for example suction. Alternatively, it may be allowed to travel while being kept taut by rolls or the like (not shown) arranged in front and at the rear of the surface plate 3, respectively. The adhesive layer 4 can be peeled from the separator 5. Since the separator 5 is in close contact with or kept taut on the surface plate 3, the separation of the adhesive layer 4 from the separator 5 is facilitated.

Pressure is developed between the heating head 2 and the surface plate 3, whereupon the electrode surface of the semiconductor chip 1, on which electrodes are formed, is brought into contact with the adhesive layer 4 having a greater area than the electrode surface. The adhesive layer 4 preferably has a size corresponding to the largest size of multiple chips to be mounted on an MCM so that the adhesive layer 4 can be used for other chips as well and can be handled with ease. In this case, the size of the adhesive layer 4 is selected so as to correspond to the shorter side of the chip with the largest size, whereby the width of the adhesive tape can be narrowed and the installation space for the apparatus can advantageously be reduced.

Figure 2A:
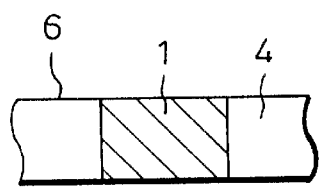
FIGS. 2A, 2B and 2C are plan views showing the width of an adhesive strip and exemplary arrangements of chips according to the present invention.
Figure 2B:
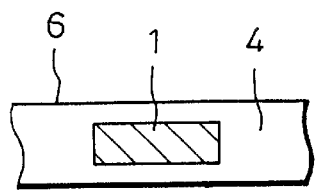
Figure 2C:
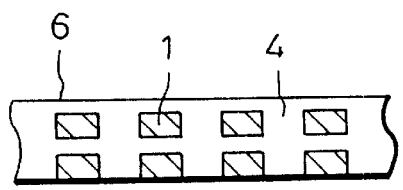

The width of the adhesive layer 4 (more generally, the width of the adhesive tape) may be substantially equal to the shorter side of the chip as shown in FIG. 2A, or may be slightly greater than the shorter side of the chip as shown in FIG. 2B. Alternatively, the adhesive layer 4 may have such a size that two chips can be arranged in the width direction of the adhesive layer 4, as shown in FIG. 2C. Any of these tape widths may be selected taking account of handling and mass-productivity.

Referring again to FIG. 1A, the heating head 2 is heated up to a predetermined temperature to directly heat a back surface of the chip 1 which is opposite the electrode surface, so that a region of the adhesive layer corresponding to the chip size is preferentially heated. During the heating, a region of the adhesive surrounding the chip 1 is scarcely heated and maintains the form of a film because the adhesive has low heat conductivity and thus little heat is transmitted to the surrounding region. On the other hand, a region of the adhesive layer 4 which is in close contact with the chip 1 adheres fast to the chip 1 as the viscosity lowers, or tackiness increases, due to the application of heat, thus increasing the film strength. Consequently, a cohesion reduction line across which the cohesive strength of the adhesive layer 4 lowers is formed along the periphery of the chip 1.

The heating temperature of the head 2 is set to a temperature at which the adhesive layer 4 softens and melts (its viscosity is preferably 1000 poises or less, more preferably 100 to 10 poises) and at the same time the hardening reaction of the adhesive is not initiated or at a low level (the rate of reaction is 20% or less), and is selected appropriately depending on the type of adhesive used. Further, the head 2 is preferably heated at a temperature lower than or equal to the activation temperature of a latent hardener, mentioned later, in order to improve the shelf stability of adhesive-coated chips.

Figure 1B:
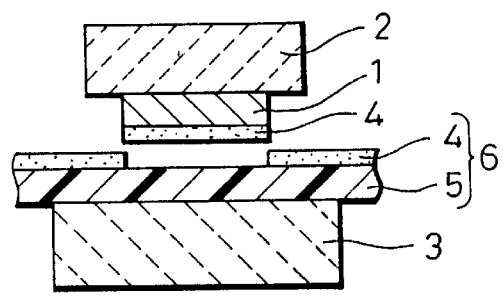

FIG. 1B shows a state in which the heating head 2 is moved away from the surface plate 3, and as illustrated, part of the adhesive layer 4 substantially equal in size to the chip 1 can be separated along the cohesion reduction line of the adhesive layer corresponding to the periphery of the chip 1 and adhere to the chip 1. Although the adhesive layer 4 on the surface plate 3 has an adhesive-free region from which adhesive has been transferred to the chip 1, the adhesive tape 6 maintains the form of a film because of the presence of the separator 5 and the remaining adhesive 4. Adhesive can be set on the surface plate 3 by removing the adhesive-free region or by moving the adhesive tape 6.

In the case shown in FIGS. 1A and 1B, an adhesive-coated chip to which the adhesive layer 4 has been transferred from the separator 5 is obtained. Thus the adhesive-coated chip can be directly connected to a circuit board, permitting continuous fabrication of MCM. When keeping the adhesive tape in stock, a separator may be affixed to the adhesive layer. In the arrangement of FIGS. 1A and 1B, various chips may be placed beforehand on the tape so that adhesive-coated chips can be efficiently obtained by removing the chips from the tape. In this case, a variety of adhesive-coated chips can be continuously fed in desired order, thus improving the productivity.

Figure 3:
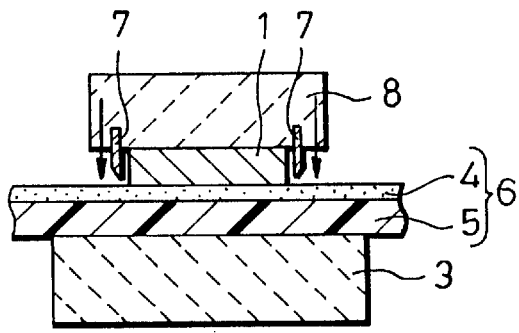
FIG. 3 is a schematic sectional view illustrating another embodiment of the present invention.

FIG. 3 is a schematic sectional view showing the manner of obtaining an adhesive-coated chip according to another embodiment of the present invention. FIG. 3 shows part of a pressure bonding apparatus, and an adhesive tape 6 consisting of an adhesive layer 4 and a separator 5 is placed between a pressure head 8, to which a chip 1 is fixed by suction, for example, and a surface plate 3. The adhesive tape 6 is brought into close contact with the surface plate 3 by suction, for example. Alternatively, the adhesive tape 6 may be allowed to travel while being kept taut by rolls or the like (not shown) arranged in front and at the rear of the surface plate 3, respectively.

The pressure head 8 is provided with a cutting jig 7. The cutting jig 7 has an edge extending along the periphery of the chip 1; in the case where the size of the chip in the width direction of the adhesive tape is substantially equal to the tape width, the cutting jig 7 may have two straight edges extending across the tape width. The adhesive layer 4 is cut by the cutting jig 7 in the thickness direction for at least a part or the whole of the depth thereof, thereby allowing part of the adhesive layer 4 with a size substantially equal to the chip size to adhere to the chip 1. At this time, the pressure head 8 may not be heated, in which case the fabrication work can be performed at room temperatures, making it possible to prevent the adhesive from being adversely affected by heat. A razor made of metal, ceramic, etc., or energy rays such as heat, ultraviolet radiation, laser beam, etc. can be used as the cutting jig 7.

In the case where a cutting tool is used as the cutting jig 7 and the adhesive layer is cut by pressing the cutting jig 7 downward, the height of the cutting jig 7 (that is, the distance from the connection surface of the chip 1) is determined taking account of the depth to which the adhesive layer 4, or both the adhesive layer 4 and the separator 5, are to be cut. The adhesive layer 4 is preferably cut for its whole depth in view of ease of separation of the adhesive-coated chip from the tape. The cutting jig 7 may in this case comprise a vertically movable mechanism which can be contained in the pressure head 8 so that continuous production efficiency can be enhanced.

Figure 4:
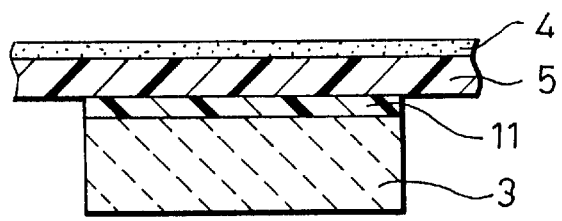
FIG. 4 is a schematic sectional view illustrating still another embodiment of the present invention.

In the arrangement shown in FIGS. 1A and 1B or in FIG. 3, a cushioning layer 11 made of rubber or the like may be interposed between the surface plate 3 and the separator 5, as shown in FIG. 4. In this case, a chip coated with adhesive corresponding in size to the periphery of the chip can advantageously be obtained with ease.

Various examples of adhesive-coated chips obtained in the above-described manner will be now explained with reference to FIGS. 5A to 5D and FIGS. 6A to 6C. In all examples described below, the electrode surface of the chip 1 is covered on its entirety with an adhesive film having an area substantially corresponding to the chip size.

Figure 5A:
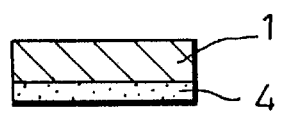
FIGS. 5A through 5D are schematic sectional views showing the structures of adhesive-coated chips according to the present invention.
Figure 5B:
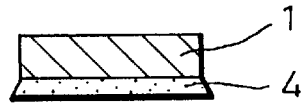
Figure 5C:
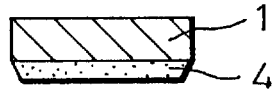
Figure 5D:
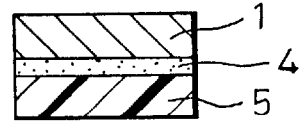

FIG. 5A illustrates a basic structure of the adhesive-coated chip, in which the semiconductor chip 1 and the adhesive layer 4 are of a substantially identical size. FIGS. 5B and 5C illustrate cases where the size of the adhesive layer 4 is made somewhat different from that of the semiconductor chip 1 for adjustment of the optimum amount of adhesive after the connection to a circuit board. The size of the adhesive layer preferably falls within a range of about ±30% with respect to the chip size in view of the shape stability of the adhesive-coated chip, and more preferably, the adhesive layer should be identical in size with the semiconductor chip. In the present invention, the sizes of the adhesive layers shown in FIGS. 5A to 5C are regarded as substantially identical with the size of the semiconductor chip. FIG. 5D illustrates the case where the separator 5 remains affixed to the adhesive layer 4, in which case dust or the like can advantageously be prevented from adhering to the adhesive layer while the semiconductor chip is kept in stock.

Figure 6A:
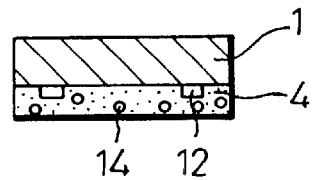
FIGS. 6A, 6B and 6C are schematic sectional views showing other examples of adhesive-coated chips according to the present invention.
Figure 6B:
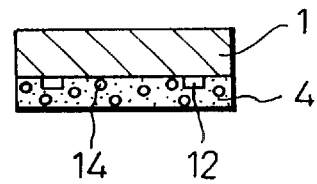
Figure 6C:
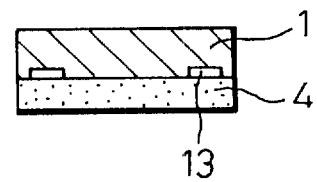

FIGS. 6A and 6B illustrate the cases where the chip has bump electrodes 12, and FIG. 6C illustrates the case where the chip has a wiring layer 13 instead of pump electrodes. In FIGS. 6A and 6B, the adhesive contains electrically conducting particles 14, and in FIG. 6C, the adhesive contains no conducting particles. The structures shown in FIGS. 6A to 6C can be combined in desired manner in respect of bump electrodes and presence/absence of conducting particles. Furthermore, as shown in FIGS. 5A–5D and FIGS. 6A–6C, the entire electrode surface of each chip (electronic part) 1, as well as all exposed surfaces of bump electrode 12, are covered by the adhesive layer 4.

Figure 7A:
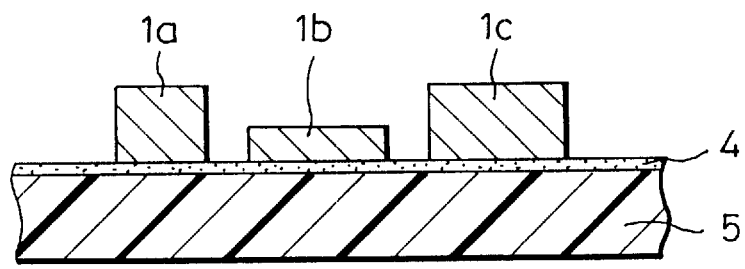
FIGS. 7A and 7B are schematic sectional views showing the arrangements of adhesive-coated chip groups according to the present invention.

FIG. 7A illustrates a group of adhesive-coated chips, wherein a plurality of chips are placed separately on the separator with their entire electrode surfaces covered with adhesive films of substantially identical size. The tape with the chips affixed thereon can be rolled up.

Figure 7B:
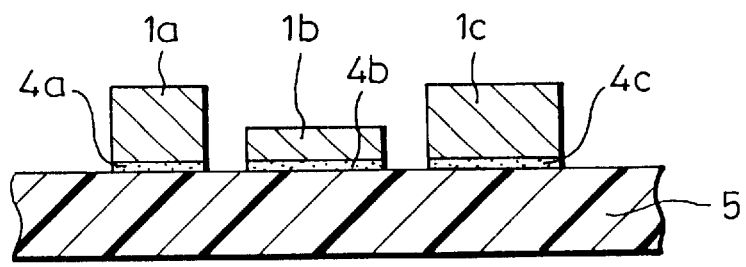

As shown in FIG. 7B, adhesive films 4a, 4b and 4c corresponding in size to respective chips may be present only on regions of the separator 5 where the chips are separately affixed. In this case, by arranging various chips on the separator in order of mounting on a circuit board, for example, it is possible to continuously feed adhesive-coated chips in order, thus enhancing the productivity.

The adhesive-coated chips obtained in the above-described manner may be used for single-chip mounting, and also for multi-chip mounting as described below.

First, using a microscope or an image storage device, the electrodes of each adhesive-coated chip are positioned accurately with respect to corresponding electrodes on a circuit board. For the positioning, registration marks may also be used. Subsequently, the electrodes to be connected to each other are applied with heat and pressure, so that multiple chips are electrically connected to a single circuit board. In this case, heat and pressure may be applied to one chip at a time, but if multiple chips can be bonded at the same time, the productivity is greatly enhanced.

To apply heat and pressure, besides an ordinary press method, a static pressure method using an autoclave etc. may be used whereby chips with different thicknesses or sizes can be applied uniformly with heat and pressure. The static pressure mentioned herein denotes a constant pressure acting perpendicularly on the surface of an object. In general, the chip is 2 to 20 mm square, whereas the interconnecting section is 1 mm or less, in many cases 0.1 mm or less, in thickness and thus is by far smaller than the chip area, permitting a sufficient pressure to act in the direction of connection of the electrodes.

During the application of heat and pressure, continuity test may be conducted to examine the electrical connection between electrodes to be connected to each other. Since continuity test can be performed while the adhesive is not set at all or is insufficiently set, repair work is facilitated. Preferably, the test is conducted when the rate of reaction of the adhesive is about 30% or less, in order to facilitate repair work using solvent. Where the rate of reaction of the adhesive is lower than 10%, pressure is preferably applied since the fixing of the electrodes is not firm enough.

Figure 8:
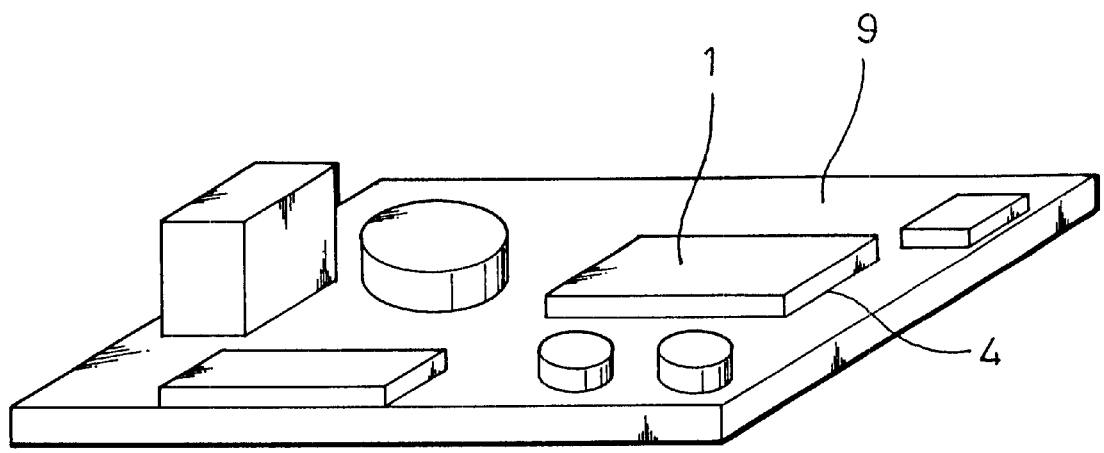
FIG. 8 is a perspective view of an MCM on which adhesive-coated chips according to the present invention are mounted.

In this manner, a plurality of chips 1 with different shapes or sizes are mounted on a circuit board 9 via the adhesive layer 4, as shown in FIG. 8, thereby obtaining a multi-chip module (MCM) in which chips are mounted at high density on the circuit board 9 of relatively small size. The circuit board 9 to which the present invention can be applied includes, for example, a plastic film of polyimide, polyester, etc., a composite material such as a glass fiber-epoxy composite material, a semiconductor of silicon etc., and an inorganic substrate of glass, ceramic, etc.

For the adhesive layer 4 used in the present invention, thermoplastic materials and various other materials which set upon receiving heat or light can be used. Preferably, those materials which set upon receiving heat or light are used since they exhibit excellent heat resistance and humidity resistance after the connection. Among these, an epoxy adhesive containing a latent hardener and an acrylic adhesive containing a radical hardener such as peroxide are especially preferred because they set in a short period of time, can improve the efficiency of the connection work, and have excellent adhesive properties due to their molecular structure. The latent hardener has a relatively distinct activation point at which heat- or pressure-induced reaction starts, and thus is suited for the present invention involving the heat/pressure application step.

As the latent hardener, imidazole, hydrazide, boron trifluoride-amine complex, amine-imide, polyamine salt, onium salt, dicyandiamide, and modified substances thereof maybe used singly or in combination to form a mixture.

These are catalytic hardeners of ionic polymerization type such as anionic or cationic polymerization type, and are preferred because they can set rapidly and because no special attention needs to be paid to chemical equivalents. Among the catalytic hardeners, an imidazole hardener is especially preferred since it is non-metallic and thus is less susceptible to electrolytic corrosion. The imidazole hardener is also used in view of reactivity and connection reliability. Further, other hardeners such as a polyamine hardener, a polymercaptan hardener, a polyphenol hardener and an acid anhydride hardener can be used, and also these hardeners may be used in combination with the aforementioned catalytic hardeners. A microencapsulated hardener in which the hardener as a core material is covered with a polymeric substance or an inorganic substance is also preferred because of its opposing properties, that is, long-term shelf stability and rapid setting property.

The hardener for the adhesive used in the present invention should preferably have an activation temperature of 40 to 200° C. If the activation temperature is lower than 40° C., the difference between the activation temperature and room temperature is so small that the adhesive needs to be kept at low temperature. If the activation temperature is higher than 200° C., other chips and the like are adversely affected by heat during the connection. For this reason, the activation temperature should preferably fall within a range of 50 to 150° C. The activation temperature mentioned herein represents an exothermic peak temperature of a compound of epoxy resin and the hardener, as a sample, which is measured by using a DSC (differential scanning calorimeter) while the sample is heated from room temperature at a rate of 10° C./min. With low activation temperature, good reactivity is achieved but the shelf stability tends to lower, and therefore, suitable activation temperature is selected taking this into consideration. According to the present invention, the shelf stability of adhesive-coated chips is improved by carrying out heat treatment at a temperature lower than or equal to the activation temperature of the hardener, and excellent multi-chip connection is achieved at a temperature higher than or equal to the activation temperature. Preferably, therefore, the melt viscosity of the adhesive is adjusted such that the aforementioned cohesion reduction line is formed at a temperature lower than or equal to the activation temperature of the hardener.

The adhesive layer 4 is preferably admixed with electrically conducting particles 14 or with a small quantity of insulating particles (not shown), since the particles serve to maintain the layer thickness at the time of application of heat and pressure during the fabrication of adhesive-coated chips. The proportion of the conducting or insulating particles admixed in this case is approximately 0.1 to 30 vol %, and is set to 0.5 to 15 vol % in order to obtain anisotropic conductivity. The adhesive layer 4 may alternatively have a multi-layer structure including an insulating layer and an electrically conducting layer formed separately from each other. In this case, resolution improves, permitting high-density connection of electrodes.

The electrically conducting particles 14 may be metal particles of Au, Ag, Pt, Co, Ni, Cu, W, Sb, Sn or solder, or particles of carbon, graphite, etc. Further, such conducting particles or nonconductive particles, such as glass particles, ceramic particles or polymeric particles of plastic, may be used as cores, which are then coated with an electrically conductive layer using one of the above substances. Also, insulator-coated particles having electrically conducting cores coated with an insulating layer, or the combination of conducting particles and insulating particles of glass, ceramic or plastic may be used to improve the resolution.

In order that one or more electrically conducting particles, preferably as many particles as possible, will be present on each fine electrode, the particle size of the conducting particles 14 should preferably be as small as 15 $\mu$m or less and, more preferably, in the range of 7 to 1 $\mu$m. If the particle size is smaller than 1 $\mu$m, difficulty arises in making the particles in contact with the electrode surfaces. Also, the conducting particles 14 should preferably be uniform in particle size, because uniform particle size serves to lessen the outflow of conducting particles from between electrodes facing each other.

Among the aforementioned electrically conducting particles, particles having polymeric cores of plastic material coated with a conductive layer and particles of heat-fusible metal such as solder are preferably used, because these particles deform when applied with pressure or both heat and pressure, so that the area of contact with circuits increases, thus improving the reliability. In particular, in the case where polymeric cores are used, the particles do not show such a distinct melting point as that of solder. Thus the softened state can advantageously be controlled over a wide range of connection temperatures and variations in the thickness or flatness of electrodes can be easily coped with.

Where hard metal particles of Ni or W, for example, or particles having a large number of protuberances on their surface are used, the conducting particles stick into the electrodes or wiring patterns. Thus low connection resistance is achieved even if an oxide film or a contamination layer exists on the electrode surface, whereby the reliability can be improved.

With the multi-chip mounting method according to the present invention, adhesive-coated chips of different sizes can be mounted as needed on a circuit board, thereby facilitating the mounting of a large number of chips on a circuit board with a small area.

According to the present invention, since chips coated with respective required amounts of adhesive are used, the number of tapes with different widths may be small and the mounting apparatus can be simplified, as compared with the case of using different adhesive tapes for different sizes of chips. Further, unlike the case where an adhesive layer is formed over the entire surface of a circuit board, neither adjacent chips nor surrounding adhesive is adversely affected by heat or pressure, and no extra adhesive is used, which is advantageous from the economical viewpoint.

In the preferred embodiment of the present invention, the adhesive contains a latent hardener, and heat treatment is performed at a temperature lower than or equal to the activation temperature of the hardener to obtain adhesive-coated chips. Accordingly, the shelf stability of the adhesive is improved, and a reliable multi-chip connection can be achieved at a temperature higher than or equal to the activation temperature.

With the multi-chip mounting method of the invention using hydrostatic pressure, the pressure within the airtight vessel is kept constant, and a large number of MCM can be treated at the same time, whereby the mass production efficiency is enhanced. Also, since the heat treatment is carried out using gas or liquid as the medium, it is unnecessary to use expensive molds, and various adhesives having different properties in respect of heat, humidity and anaerobic characteristic can be used depending on the type of medium used. Further, even if the adhesive takes a long time to set, it is possible to produce a large number of MCM by one operation.

According to the multi-chip mounting method of the present invention, a continuity test can be performed before the adhesive finally sets. Therefore, when a defective connection is discovered, the adhesive is then still not sufficiently set, and thus the peeling of chips and the subsequent cleaning operation using a solvent such as acetone can be carried out very easily, thereby facilitating the repair work.

Also, by arranging groups of adhesive-coated chips on the separator in order of mounting on circuit boards, it is possible to improve the productivity.

In the method of producing adhesive-coated chips according to the present invention, a cohesion reduction line is readily formed in the adhesive layer around the chip when the chip is heated. Since the adhesive layer can be peeled from the separator, a chip coated with an adhesive layer having a size corresponding to the chip size can be obtained relatively easily. By setting the heating temperature at a temperature lower than or equal to the activation temperature of the hardener, the adhesive-coated chips can be kept for later use without lowering their shelf stability.

According to the adhesive-coated chip production method of the present invention, the adhesive layer is cut for at least part of its depth in the thickness direction by using a very simple cutting jig matching the chip shape, so that a chip coated with an adhesive layer having a size corresponding to the chip size can be obtained relatively easily.

EXAMPLES

Various examples according to the present invention are described in detail below, but it should be noted that the present invention is not limited to these examples alone.

Example 1

(1) Preparation of Adhesive Layer

A solution containing 30% of ethyl acetate was obtained by mixing, in the ratio of 30/70, a phenoxy resin (polymeric epoxy resin) and a liquid epoxy resin (epoxy equivalent: 185) containing a micro-encapsulated latent hardener. To this solution was added 2 vol % of electrically conducting particles, which were obtained by coating polystyrene particles having a particle size of 3±0.2 µm with Ni and Au in thicknesses of 0.2 µm and 0.02 µm, respectively, followed by mixing and dispersion of the conducting particles. The dispersion was applied to a separator (polyethylene terephthalate film treated with silicone; thickness: 40 µm) by means of a roll coater, and the separator applied with the dispersion was dried at 100° C. for 20 minutes to obtain an adhesive film with a thickness of 20 µm.

The activation temperature of the adhesive film was measured using a DSC and was found to be 120° C. Using a model composition from which the hardener had been removed, the viscosity of the adhesive layer was measured by a digital viscometer HV-8 (manufactured by Kabushiki Kaisha Reska), and was 800 poises at 100° C.

The adhesive film was cut together with the separator to obtain a tape of 2 mm wide.

(2) Fabrication of Adhesive-coated Chip

The tape obtained in the manner described in (1) above was set in a chip mounting apparatus AC-SC450B (COB connecting apparatus manufactured by Hitachi Chemical Co., Ltd.) with its adhesive layer facing upward, and was held tense by rolls arranged in the front and at the rear of the surface plate in such a manner that the tape could travel in close contact with the surface plate. An IC chip for evaluation (2×10 mm silicon substrate having a thickness of 0.5 mm and having 300 gold electrodes (called bumps) of 50 µm in diameter and 20 µm high formed near the two longer sides of the substrate) was fixed to the heating head in position by suction.

With the temperature of the heating head set at 110° C., the tape was subjected to heat-pressure bonding such that its adhesive layer was applied with 5 kg/cm$^2$ for 3 seconds, and then the heating head was raised to release the tape from pressure and separated from the surface plate. The actual temperature of the adhesive of the tape in contact with the surface of the IC chip was in this case 102° C. at the maximum. In this manner, an adhesive-coated chip with an adhesive layer, which had been separated from the separator and had a size nearly identical to the chip size, was obtained.

Two 5×5 mm IC chips (tape width: 5.5 mm) and one IC chip of 10 mm in diameter (tape width: 10.5 mm) were prepared in a like manner, thereby obtaining a total of four adhesive-coated chips. These chips had different bump pitches, but had the same bump height and the same silicon substrate thickness.

(3) Connection On a 15×25 mm glass epoxy substrate (FR-4 grade) which had a thickness of 0.8 mm, had copper circuits of 18 µm high thereon, and had connection electrodes formed at terminals of the circuits at pitches corresponding to the bump pitches of the respective IC chips obtained in the manner described in (2) above, the adhesive-coated IC chips were arranged. After the electrodes were positioned relative to each other using a CCD camera, the chips were collectively connected at 150° C. under 20 kgf/mm$^2$ for 15 seconds. Consequently, an MCM with four adhesive-coated chips of substantially equal height collectively mounted thereon was obtained. At the time of the connection, a Polytetrafluoroethlene sheet of 100 µm thick was interposed as a buffering member between the chips and the heating head.

(4) Evaluation

The electrodes of the individual chips could be satisfactorily connected to the corresponding electrodes on the substrate. Since the adhesive was present only in the vicinity of the chips, almost no superfluous adhesive could be observed on the surface of the substrate. Further, one MCM could be obtained within one minute.

Example 2

IC chips were mounted on a substrate in substantially the same manner as in Example 1, but the adhesive-coated chips were produced by a different method. Specifically, a pressure head provided with a cutting jig was used, and the tape used had a width of 10 mm. For the 2×10 mm chip, for example, a heater wire comprising a nichrome wire and arranged so as to extend along the four sides of the chip was used as the cutting jig. The pressure head was not heated and was used at room temperature. Since a heater wire was used as the cutting jig, the tape could be cut for the entire depth inclusive of the separator, so that an adhesive-coated chip having a separator affixed to its adhesive layer was obtained. Other chips could also be similarly affixed with adhesive. For the chip of 10 mm in diameter, a looped heater wire with an inner diameter of 11 mm was used as the cutting jig. Also in this case, the electrodes of the individual chips could be satisfactorily connected to the corresponding electrodes on the substrate. Since the adhesive was present only in the vicinity of the chips, almost no superfluous adhesive could be observed on the surface of the substrate.

Example 3

IC chips were mounted on a substrate in substantially the same manner as in Example 2, but when producing adhesive-coated chips, the temperature of the heating head was set at 70° C. Further, a cutting tool with a straight edge was used as the razor. Also in this case, adhesive-coated chips could be easily obtained. Since both the razor and the heating means were used, the adhesive could be readily transferred to the chips. Furthermore, the heating temperature could be set at a low temperature, as compared with the case of Example 1.

Example 4

IC chips were mounted on a substrate in substantially the same manner as in Example 1, but the adhesive-coated chips were producing by a different method. Specifically, various chips were temporarily fixed (by heat-pressure bonding at 100° C. under 5 kg/cm$^2$ for 3 seconds) beforehand on a tape (width: 10.5 mm) so that the chips could be continuously fed in order, as shown in FIG. 7A, and adhesive-coated chips each with an adhesive layer, which had been separated from the separator and had a size nearly identical to the corresponding chip size, were obtained in the same manner as in Example 1. In this case, the adhesive could be easily peeled from the separator, and since the chips were prepared in order of mounting, the productivity was extremely high. The electrodes of the individual chips could be satisfactorily connected to the corresponding electrodes on the substrate.

Example 5

Adhesive-coated chips obtained in the same manner as in Example 4 were again temporarily fixed on a continuous separator at intervals of 1 mm between adjacent chips, to obtain a series of adhesive-coated chips as shown in FIG. 7B. The productivity was extremely high because the chips could be removed from the separator in mounting order. The electrodes of the individual chips could be satisfactorily connected to the corresponding electrodes on the substrate. Also, since the series of adhesive-coated chips could be wound on a reel with an outside diameter of 55 mm into a compact size, the chips could be easily kept in cold storage after operation. The electrodes of the individual chips could be satisfactorily connected to the corresponding electrodes on the substrate.

Example 6

IC chips were mounted on a substrate in substantially the same manner as in Example 1, but a different adhesive was used. Specifically, when preparing the adhesive mentioned above, no electrically conducting particles were added. Also in this case, the electrodes of the individual chips could be satisfactorily connected to the corresponding electrodes on the substrate. Presumably this is because the bumps of the chips and the connection electrodes of the glass epoxy substrate were brought into direct contact with each other and were firmly bonded together by the adhesive.

Example 7

IC chips were mounted on a substrate in substantially the same manner as in Example 1, but an intermediate inspection step was additionally provided to inspect the electrical connection between the electrodes after the adhesive-coated chips were obtained. First, the adhesive-coated chips using the adhesive obtained according to Example 6 were heated at 150° C. under 20 kgf/mm$^2$, and upon lapse of 2 seconds, the connection resistance at individual connection points was measured using a multimeter while the chips were kept under pressure. Similar adhesive-coated chips were connected at 150° C. under 20 kgf/mm$^2$ for 4 seconds, and then the substrate was removed from the connecting apparatus. Since in this stage the adhesive had started to set due to application of heat and pressure, the individual IC chips were temporarily fixed on the substrates. These substrates were inspected with no pressure applied thereto, and had one defective IC chip each.

The defective IC chips were mechanically peeled off and new chips were connected in the aforementioned manner; in this case, the chips could be satisfactorily connected. In both cases, since the adhesives were not sufficiently set, the peeling of the chips and the subsequent cleaning operation using a solvent could be performed very easily, facilitating the repair work. Using the DSC, the rates of reaction of the adhesives were measured in terms of heat quantity, and were found to be 7% in the former case and 20% in the latter.

After the connection inspection step and the repair step described above, the IC chips were connected at 150° C. under 20 kgf/mm$^2$ for 15 seconds, and they showed good connection characteristics in both cases. After the adhesive sets, it is extremely difficult to peel off the chips and clean the substrate by using a solvent, but according to this example, repair work could be performed with ease though numerous chips were mounted on a small-sized substrate.

Example 8

IC chips were mounted on a substrate by a method similar to that employed in Example 1, but static pressure was utilized in the step of applying heat and pressure at the time of connection.

Specifically, adhesive-coated chips were placed on a glass epoxy substrate, and after the electrodes were positioned relative to each other using a CCD camera, the substrate having the chips temporarily fixed thereon was set in a pressure pot for pneumatic pressure treatment at 120° C. under 20 kgf/cm$^2$ for 30 minutes, then cooled to room temperature, and removed from the pressure pot. According to this example, since the individual chips can be applied with uniform pressure regardless of their heights, it is unnecessary to use a buffering member unlike Example 1. Also, it is possible to treat a large number of MCM at a time depending on the capacity of the pressure pot.

Example 9

IC chips were mounted on a substrate in substantially the same manner as in Example 1, but a polytetrafluoroethylene film (thickness: 80 $\mu$m) was used as the separator. The obtained MCM was evaluated in the same manner as in Example 1, and it was found that the adhesive could be transferred to the surfaces of the chips in more exact shape matching the chip size especially at the edges. Presumably this is because the separator was more flexible than that used in Example 1 and thus the adhesive could be cut sharply along the edges of the chips. The elasticity modulus of the polyethylene terephthalate film was 200 kgf/mm$^2$, while the elasticity modulus of the polytetrafluoroethylene film was 40 kgf/mm$^2$.

Example 10

IC chips were mounted on a substrate in substantially the same manner as in Example 1, but the adhesive-coated chips were produced with a silicone rubber sheet of 0.5 mm thick interposed between the separator and the surface plate. In this case, the adhesive could be transferred to the surfaces of the chips in more exact shape matching the chip size than in Example 1, especially at the edges. This is presumably because the silicone rubber sheet served as a cushioning member. Also in the case where a soft rubber layer exists under the separator, the thickness of the adhesive layer formed on the electrode surface is controlled by the heights of the bumps and the electrically conducting particles; therefore, the bumps each had an adhesive layer of about 4 $\mu$m thick formed thereon and the region other than the bumps had an adhesive layer of about 20 $\mu$m thick formed thereon, which thickness is identical to the original thickness.

Comparative Example

Following the method of mounting IC chips on a substrate employed in Example 1, the adhesive film with the separator was cut into pieces corresponding in shape to respective chip sizes, and the cut pieces were affixed to the respective electrode surfaces. Since the chips were small, it took much time to affix the cut pieces accurately to the chips. More than twenty minutes were required to obtain one MCM, and thus the efficiency was low compared with Example 1 in which one MCM could be produced within one minute.

As is clear from the above description of the examples and the comparative example, according to the present invention, the adhesive layer can be formed accurately on the electrode surfaces of individual chips with different sizes, and also multiple chips of different sizes can be mounted at a time, whereby MCM can be fabricated with high efficiency.

What is claimed is:

1. An apparatus comprising:

a connection sheet including a separator layer and an adhesive film layer formed on said separator layer such that said adhesive film layer can be peeled from said separator layer, wherein a cohesive strength of said adhesive film layer is decreased when said adhesive film layer is heated to a predetermined temperature; and a plurality of electronic parts, each of said electronic parts having an electrode surface and at least one electrode on said electrode surface, said electrode surface of each of said electronic parts affixed to said adhesive film layer such that said adhesive film layer coats all exposed portions of said electrode surface and coats all exposed surfaces of said at least one electrode, wherein said cohesive strength of said adhesive film layer is such that when said adhesive film layer is heated to the predetermined temperature, only a portion of said adhesive film layer immediately surrounding each of said electronic parts will be peeled from said separator layer when said each of said electronic parts is removed from said adhesive film layer.

2. The apparatus of claim 1, wherein said adhesive film layer includes electrically conductive particles.

3. The apparatus of claim 2, wherein each of said electrically-conductive particles has a length in a range of 1 µm to 7 µm.

4. The apparatus of claim 1, wherein a viscosity of said adhesive film layer is no greater than 1000 poises.

5. The apparatus of claim 4, wherein said viscosity of said adhesive film layer is in a range of 10 poises to 100 poises.

6. The apparatus of claim 1, wherein said adhesive film layer includes a hardener material.

7. The apparatus of claim 6, wherein said hardener material includes at least one of imidazole, hydrazide, boron trifluoride-amine complex, amine-imide, polyamine salt, onium salt, and dicyandiamide.

8. The apparatus of claim 6, wherein said hardener material has an activation temperature in a range of 40° to 200° C.

9. An apparatus comprising:

a connection sheet including a separator layer and an adhesive film layer formed on said separator layer such that said adhesive film layer can be peeled from said separator layer; and a plurality of electronic parts arranged on said adhesive film layer such that an electrode surface of each of said electronic parts is affixed to said adhesive film layer;

wherein said adhesive film layer has a cohesive strength sufficient to hold and retain each of said electronic parts when a temperature of said adhesive film layer is below 40° C., and sufficient to release each of said electronic parts when a temperature of said adhesive film layer is at or above 40° C., wherein said cohesive strength of said adhesive film layer is such that when said adhesive film layer is heated to a temperature at or above 40°, only a portion of said adhesive film layer immediately surrounding each of said electronic parts will be peeled from said separator layer when said each of said electronic parts is removed from said adhesive film layer.

10. The apparatus of claim 9, wherein said adhesive film layer includes electrically-conductive particles.

11. The apparatus of claim 10, wherein each of said electrically-conductive particles has a length in a range of 1 µm to 7 µm.

12. The apparatus of claim 9, wherein a viscosity of said adhesive film layer is no greater than 1000 poises.

13. The apparatus of claim 12, wherein said viscosity of said adhesive film layer is in a range of 10 poises to 100 poises.

14. The apparatus of claim 9, wherein said adhesive film layer includes a hardener material.

15. The apparatus of claim 14, wherein said hardener material includes at least one of imidazole, hydrazide, boron trifluoride-amine complex, amine-imide, polyamine salt, onium salt, and dicyandiamide.

16. The apparatus of claim 14, wherein said hardener material has an activation temperature in a range of 40° to 200° C.

* * * * *